United States Patent
Choi et al.

(10) Patent No.: US 10,473,742 B2
(45) Date of Patent: Nov. 12, 2019

(54) MAGNETIC RESONANCE IMAGING APPARATUS AND METHOD OF GENERATING MAGNETIC RESONANCE IMAGE BY USING THE SAME

(71) Applicant: SAMSUNG ELECTRONICS CO., LTD., Suwon-si (KR)

(72) Inventors: Joon-sung Choi, Anyang-si (KR); Jin-young Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 138 days.

(21) Appl. No.: 15/432,376

(22) Filed: Feb. 14, 2017

(65) Prior Publication Data

US 2017/0254867 A1 Sep. 7, 2017

(30) Foreign Application Priority Data

Mar. 2, 2016 (KR) .................. 10-2016-0025037

(51) Int. Cl.
*G01R 33/48* (2006.01)
*G01R 33/483* (2006.01)
(Continued)

(52) U.S. Cl.
CPC ..... *G01R 33/4818* (2013.01); *G01R 33/4833* (2013.01); *G01R 33/5616* (2013.01);
(Continued)

(58) Field of Classification Search
CPC .............. G01R 33/4818; G01R 33/482; G01R 33/4824; G01R 33/4833; G01R 33/5611;
(Continued)

(56) References Cited

U.S. PATENT DOCUMENTS 5,323,110 A 6/1994 Fielden et al.
6,541,970 B1 4/2003 Takizawa et al.
(Continued)

FOREIGN PATENT DOCUMENTS

JP 11-113877 A 4/1999
JP 2001-276017 A 10/2001
(Continued)

OTHER PUBLICATIONS

Communication issued by the Korean Intellectual Property Office dated Sep. 19, 2017 in counterpart Korean Patent Application No. 10-2016-0025037.
(Continued)

*Primary Examiner* — Rishi R Patel
(74) *Attorney, Agent, or Firm* — Sughrue Mion, PLLC

(57) ABSTRACT

A magnetic resonance imaging apparatus includes a radio frequency (RF) controller configured to, during a repetition time (TR) period among TR periods, apply at least one RF pulse corresponding to a first slice to an object, and apply a navigator RF pulse corresponding to a second slice adjacent to the first slice to the object, a data obtainer configured to, during the TR period, obtain first k-space data corresponding to the applied at least one RF pulse, and obtain second k-space data corresponding to the applied navigator RF pulse, and an image processor configured to generate navigator images, based on pieces of second k-space data that are obtained during the TR periods, the pieces comprising the second k-space obtained during the TR period, correct the first k-space data, based on the navigator images, and generate a magnetic resonance image of the first slice, based on the corrected first k-space data.

20 Claims, 14 Drawing Sheets

(51) Int. Cl.
*G01R 33/561* (2006.01)
*G01R 33/565* (2006.01)

(52) U.S. Cl.
CPC ...... *G01R 33/56509* (2013.01); *G01R 33/482* (2013.01); *G01R 33/4824* (2013.01); *G01R 33/5611* (2013.01); *G01R 33/5613* (2013.01)

(58) Field of Classification Search
CPC ............ G01R 33/5613; G01R 33/5616; G01R 33/56509; G01R 33/5676; G01R 33/5617
See application file for complete search history.

(56) References Cited

U.S. PATENT DOCUMENTS

| | | | |
|---|---|---|---|
| 6,586,935 | B1 | 7/2003 | Ma et al. |
| 6,842,001 | B2 | 1/2005 | Ikezaki |
| 7,239,138 | B2 | 7/2007 | Smink |
| 7,443,946 | B2 | 10/2008 | Deller et al. |
| 9,223,001 | B2 | 12/2015 | Beck |
| 9,427,171 | B2 | 8/2016 | Gdaniec et al. |
| 2003/0117136 | A1* | 6/2003 | Wang ................ G01R 33/5676 324/306 |
| 2011/0038520 | A1* | 2/2011 | Yui .................... G01R 33/5676 382/131 |
| 2013/0187649 | A1 | 7/2013 | Bhat et al. |
| 2013/0307542 | A1* | 11/2013 | Chen ................. G01R 33/5613 324/318 |
| 2015/0212182 | A1 | 7/2015 | Nielsen et al. |
| 2015/0323637 | A1 | 11/2015 | Beck et al. |
| 2017/0205487 | A1* | 7/2017 | Zeller ................ G01R 33/5676 |

FOREIGN PATENT DOCUMENTS

| | | |
|---|---|---|
| JP | 2006-501919 A | 1/2006 |
| JP | 2013-509904 A | 3/2013 |
| JP | 2015-506775 A | 3/2015 |
| JP | 2015-510804 A | 4/2015 |
| JP | 2015-532610 A | 11/2015 |
| KR | 10-2004-0017777 A | 2/2004 |
| WO | 2014/160701 A2 | 10/2014 |

OTHER PUBLICATIONS

Communication dated Dec. 15, 2017, from the European Patent Office in counterpart European Application No. 17158914.6.
Communication dated May 26, 2017, issued by the Korean Intellectual Property Office in counterpart Korean Patent Application No. 10-2016-0025037.

* cited by examiner

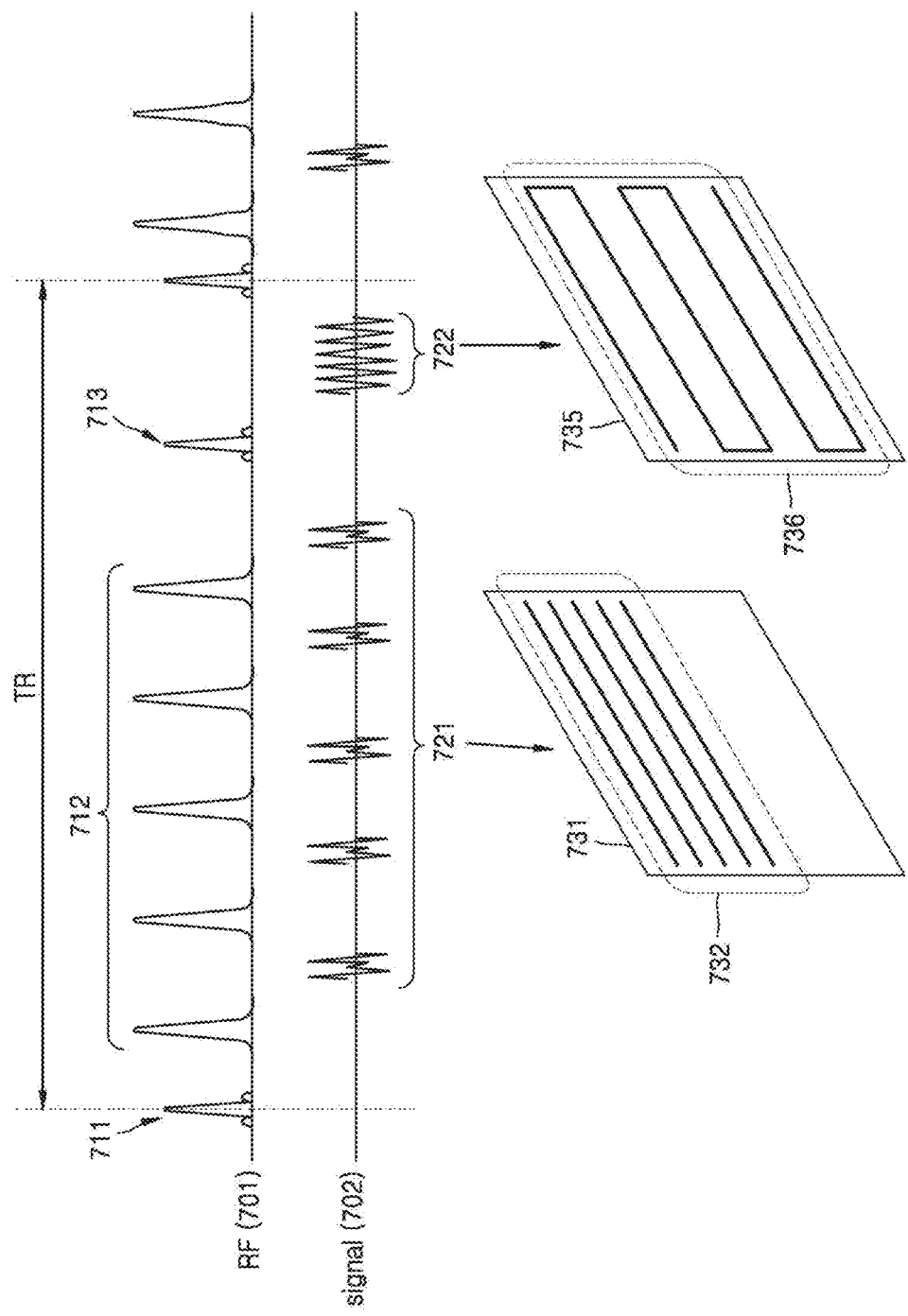

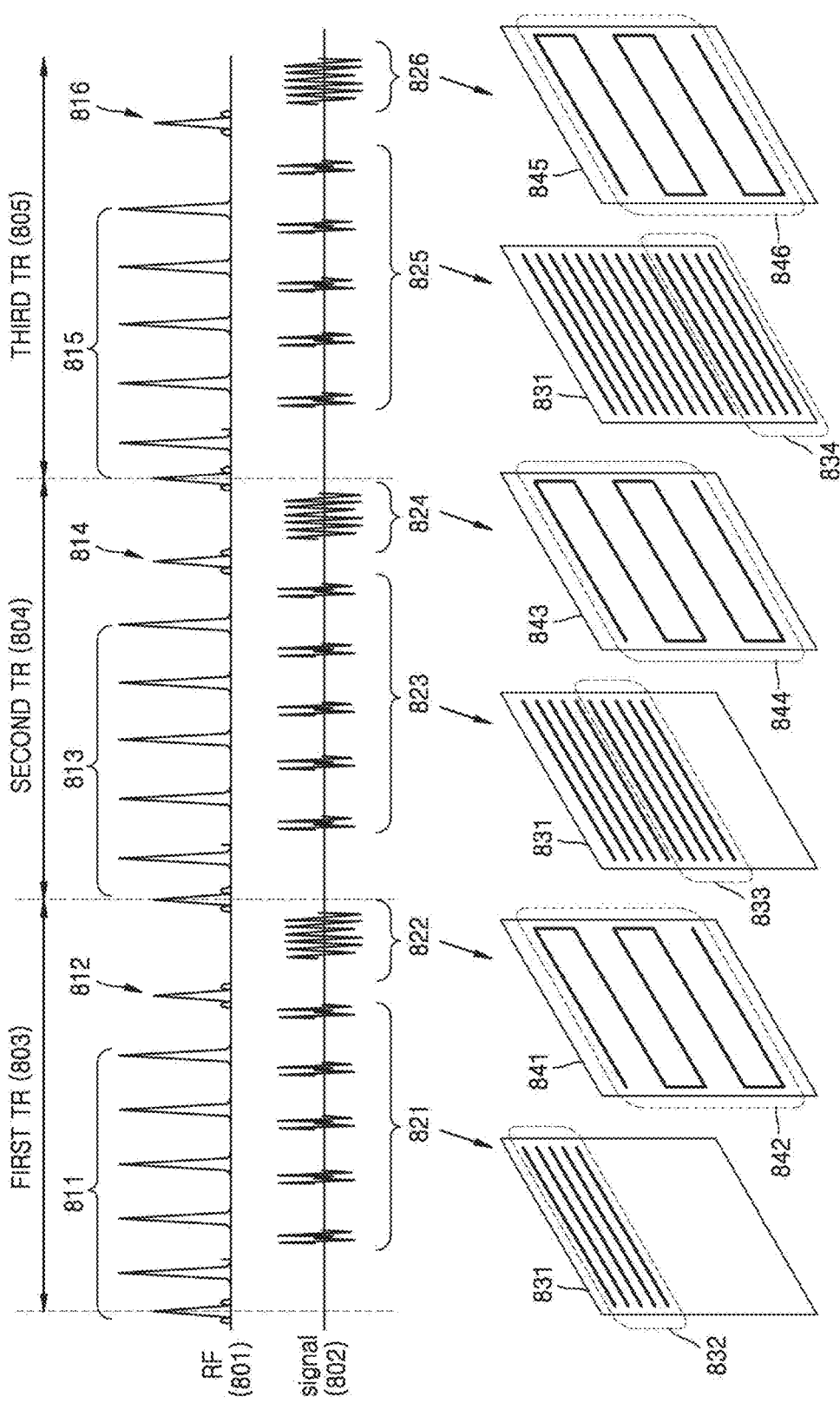

MAGNETIC RESONANCE IMAGING APPARATUS AND METHOD OF GENERATING MAGNETIC RESONANCE IMAGE BY USING THE SAME

CROSS-REFERENCE TO RELATED APPLICATION

This application claims priority from Korean Patent Application No. 10-2016-0025037, filed on Mar. 2, 2016, in the Korean Intellectual Property Office, the disclosure of which is incorporated herein by reference in its entirety.

BACKGROUND

1. Field

Apparatuses and methods consistent with exemplary embodiments relate to a magnetic resonance imaging (MRI) apparatus and a method of generating a magnetic resonance image (MR image) by using the MRI apparatus.

2. Description of the Related Art

A magnetic resonance imaging (MRI) apparatus captures an image of a target object by using a magnetic field. Because the MRI apparatus three-dimensionally illustrates images of bones, discs, joints, ligaments, or the like at a user-desired angle, the MRI apparatus is widely used to make a correct disease diagnosis.

The MRI apparatus obtains a magnetic resonance (MR) signal, reconstructs the obtained MR signal to an image, and outputs the image. In more detail, the MRI apparatus obtains the MR signal by using a high-frequency multi-coil including radio frequency (RF) coils, permanent-magnets, gradient coils, etc.

However, the MRI apparatus may use a long time to obtain an MR image. When an image obtainment time period increases, a distortion may occur due to a target object's movement such as heartbeats, breathing, peristalsis, or the like, so that the MRI apparatus may not obtain a high quality MR image.

SUMMARY

Exemplary embodiments may address at least the above problems and/or disadvantages and other disadvantages not described above. Also, the exemplary embodiments are not required to overcome the disadvantages described above, and may not overcome any of the problems described above.

Exemplary embodiments provide a magnetic resonance imaging (MRI) apparatus and a method of generating a magnetic resonance image (MR image) by using the MRI apparatus.

According to an aspect of an exemplary embodiment, there is provided a magnetic resonance imaging (MRI) apparatus for capturing a magnetic resonance (MR) image during a plurality of repetition time (TR) periods, the MRI apparatus including a radio frequency (RF) controller configured to, during a TR period among the TR periods, apply at least one RF pulse corresponding to a first slice to an object, and apply a navigator RF pulse corresponding to a second slice adjacent to the first slice to the object. The MRI apparatus further includes a data obtainer configured to, during the TR period, obtain first k-space data corresponding to the applied at least one RF pulse, and obtain second k-space data corresponding to the applied navigator RF pulse. The MRI apparatus further includes an image processor configured to generate navigator images, based on pieces of second k-space data that are obtained during the TR periods, the pieces comprising the second k-space obtained during the TR period, correct the first k-space data, based on the navigator images, and generate the MR image of the first slice, based on the corrected first k-space data.

The data obtainer may be further configured to arrange the first k-space data in a part of a first k-space, and arrange the second k-space data in an entirety of a second k-space.

The image processor may be further configured to generate a navigator image, based on the second k-space.

A first echo time (TE) corresponding to the at least one RF pulse may be longer than a second TE corresponding to the navigator RF pulse.

The image processor may be further configured to select a reference navigator image from the navigator images, and correct the first k-space data, based on a difference between the navigator images and the selected reference navigator image.

The image processor may be further configured to divide the reference navigator image into reference blocks, divide the navigator images into comparison blocks respectively corresponding to the reference blocks, and correct the first k-space data, based on a difference between vector information of the reference blocks and vector information of the comparison blocks.

The RF controller may be further configured to apply the navigator RF pulse to the object at regular TR period intervals during the TR periods.

The navigator images may have a resolution lower than a resolution of the MR image.

The RF controller may be further configured to apply RF pulses corresponding to the first slice to the object, based on a fast spin-echo technique.

The RF controller may be further configured to apply the navigator RF pulse to the object, based on an echo-planar imaging technique.

According to an aspect of an exemplary embodiment, there is provided a method of generating a magnetic resonance (MR) image during repetition time (TR) periods, the method being performed by a magnetic resonance imaging (MRI) apparatus, and the method including applying at least one radio frequency (RF) pulse corresponding to a first slice to an object, and applying a navigator RF pulse corresponding to a second slice adjacent to the first slice to the object, during a TR period among the TR periods. The method further includes obtaining first k-space data corresponding to the applied at least one RF pulse, and obtaining second k-space data corresponding to the applied navigator RF pulse, during the TR period. The method further includes generating navigator images, based on pieces of second k-space data that are obtained during the TR periods, the pieces comprising the second k-space obtained during the TR period, correcting the first k-space data, based on the navigator images, and generating the MR image of the first slice, based on the corrected first k-space data.

The obtaining of the first k-space data may include arranging the first k-space data in a part of a first k-space, and the obtaining of the second k-space data may include arranging the second k-space data in an entirety of a second k-space.

The correcting of the first k-space data may include selecting a reference navigator image from the navigator images, and correcting the first k-space data, based on a difference between the navigator images and the selected reference navigator image.

The correcting of the first k-space data may include dividing the reference navigator image into reference blocks, dividing the navigator images into comparison blocks respectively corresponding to the reference blocks, and correcting the first k-space data, based on a difference between vector information of the reference blocks and vector information of the comparison blocks.

The applying of the navigator RF pulse may include applying the navigator RF pulse to the object at regular TR period intervals during the TR periods.

The navigator images may have a resolution lower than a resolution of the MR image.

The applying of the at least one RF pulse may include applying RF pulses corresponding to the first slice to the object, based on a fast spin-echo technique.

The applying of the navigator RF pulse may include applying the navigator RF pulse to the object, based on an echo-planar imaging technique.

A non-transitory computer-readable storage medium may store a program for causing a computer to perform the method.

BRIEF DESCRIPTION OF THE DRAWINGS

The above and/or other aspects will become apparent and more readily appreciated from the following description of example embodiments, taken in conjunction with the accompanying drawings in which:

FIG. 7 is a diagram illustrating an operation performed by the MRI apparatus of FIG. 3;

FIG. 8 is a diagram illustrating another operation performed by the MRI apparatus of FIG. 3;

DETAILED DESCRIPTION

Figure 1:
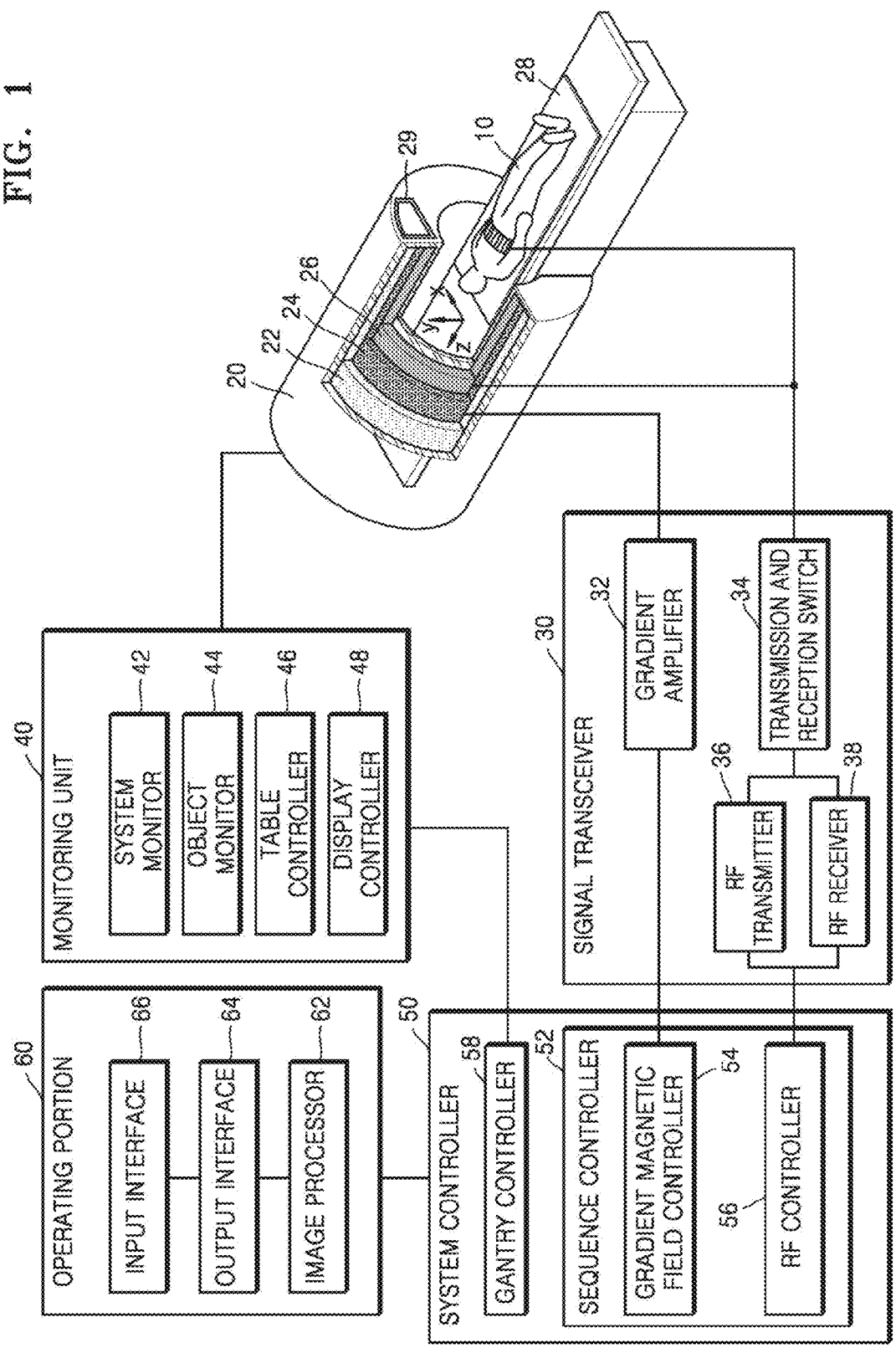
FIG. 1 is a block diagram of a general magnetic resonance imaging (MRI) system.

Exemplary embodiments are described in greater detail below with reference to the accompanying drawings.

All terms including descriptive or technical terms that are used herein may be construed as having meanings that are obvious to one of ordinary skill in the art. However, the terms may have different meanings according to an intention of one of ordinary skill in the art, precedent cases, or the appearance of new technologies. Also, some terms may be arbitrarily selected by the applicant, and in this case, the meaning of the selected terms will be described in detail in the detailed description of the disclosure. Thus, the terms used herein have to be defined based on the meaning of the terms together with the description throughout the specification.

While terms "first" and "second" are used to describe various components, it is obvious that the components are not limited to the terms "first" and "second." The terms "first" and "second" are used only to distinguish between each component. For example, a first component may indicate a second component or a second component may indicate a first component without conflicting with the disclosure. As used herein, the term "and/or" includes any and all combinations of one or more of the associated listed items.

Also, when a part "includes" or "comprises" an element, unless there is a particular description contrary thereto, the part can further include other elements, not excluding the other elements. The term 'unit' in the exemplary embodiments of the disclosure means a software component or hardware components such as a field-programmable gate array (FPGA) or an application-specific integrated circuit (ASIC), and performs a function. However, the term 'unit' is not limited to software or hardware. The 'unit' may be formed to be in an addressable storage medium, or may be formed to operate one or more processors. Thus, for example, the term 'unit' may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and 'units' may be associated with the smaller number of components and 'units,' or may be divided into additional components and 'units.'

The present disclosure will now be described more fully with reference to the accompanying drawings, in which example embodiments of the present disclosure are shown. The disclosure may, however, be embodied in many different forms and may not be construed as being limited to the exemplary embodiments set forth herein; rather, these example embodiments are provided so that this disclosure will be thorough and complete, and will fully convey the concept of the disclosure to one of ordinary skill in the art. In the following description, well-known functions or constructions may not be described in detail because they would obscure the disclosure with unnecessary detail. Throughout the specification, like reference numerals in the drawings denote like elements.

Expressions such as "at least one of," when preceding a list of elements, modify the entire list of elements and do not modify the individual elements of the list.

Throughout the specification, an "image" may mean multi-dimensional data including discrete image elements (e.g., pixels of a two-dimensional (2D) image and voxels of a three-dimensional (3D) image). For example, the image may include a medical image of an object that is obtained by using an X-ray diagnosis system, a computed tomography (CT) diagnosis system, a magnetic resonance imaging (MRI) diagnosis system, an ultrasound diagnosis system, or another medical diagnosis system.

Also, throughout the specification, an "object" may include a human, an animal, or a part of a human or animal. For example, the object may include organs such as liver, heart, womb, brain, breast, abdomen, or the like, or a blood vessel. Also, the object may include a phantom. The phantom means a material having a volume that is very close to a density and effective atomic number of an organism, and may include a sphere phantom having a characteristic similar to a physical body.

Throughout the specification, an "MR image" refers to an image of a target object, the image being captured based on the science of Nuclear Magnetic Resonance (NMR).

Throughout the specification, a "pulse sequence" refers to continuity of signals that are repeatedly applied from the MRI apparatus to the target object. The pulse sequence may include time parameters of a radio frequency (RF) pulse, e.g., a repetition time (TR) period or an echo time (TE).

Throughout the specification, the "pulse sequence schematic diagram" shows an order of events occurring in the MRI apparatus. For example, the pulse sequence schematic diagram may show RF pulses, gradient magnetic fields, MR signals, etc., according to time.

Throughout the specification, the term "repetition time (TR) period" may refer to a repetition time of an RF pulse. For example, the TR period may refer to a time period from a transmission time of an RF pulse having a predetermined magnitude to a re-transmission time of the RF pulse having the predetermined magnitude.

Throughout the specification, a term "echo time (TE)" may refer to a time period from transmission of an RF pulse to measurement of an MR signal.

Throughout the specification, the term "spatial encoding" may refer to obtaining spatial information in an axis direction of a gradient magnetic field by applying a linear gradient magnetic field causing additional of proton spin dephasing, in addition to proton spin dephasing caused by an RF signal.

Throughout the specification, the term "slice" may refer to a unit area on a target object from which the MRI apparatus obtains an MR signal.

The MRI apparatus is an apparatus for obtaining a sectional image of a part of a target object by expressing, in a contrast comparison, a magnitude of an MR signal with respect to an RF signal generated in a magnetic field having a strength. For example, if an RF signal that only resonates a specific atomic nucleus (for example, a hydrogen atomic nucleus) is emitted for an instant toward the target object placed in a strong magnetic field and then such emission stops, an MR signal is emitted from the specific atomic nucleus, and thus the MRI apparatus may receive the MR signal and obtain an MR image. The MR signal denotes an RF signal emitted from the target object. The magnitude of the MR signal may be determined according to a density of a predetermined atom (for example, hydrogen) of the object, a relaxation time T1, a relaxation time T2, and a flow of blood or the like.

MRI apparatuses include characteristics different from those of other imaging apparatuses. Unlike imaging apparatuses such as CT apparatuses that obtain images according to a direction of detection hardware, the MRI apparatuses may obtain 2D images or 3D volume images that are oriented toward an optional point. The MRI apparatuses do not expose target objects or examiners to radiation, unlike CT apparatuses, X-ray apparatuses, position emission tomography (PET) apparatuses, and single photon emission CT (SPECT) apparatuses, may obtain images having high soft tissue contrast, and may obtain neurological images, intravascular images, musculoskeletal images, and oncologic images that are used to precisely capture abnormal tissues.

FIG. 1 is a block diagram of a general MRI system.

Referring to FIG. 1, the MRI system may include a gantry 20, a signal transceiver 30, a monitor 40, a system controller 50, and an operating portion 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward a target object 10.

The main magnet 22, the gradient coil 24, and the RF coil 26 may be arranged in a predetermined direction of the gantry 20. The predetermined direction may be a coaxial cylinder direction. The target object 10 may be positioned on a table 28 that is capable of being inserted into a cylinder along a horizontal axis of the cylinder.

The main magnet 22 generates a magnetostatic field or a positive field for aligning magnetic dipole moments of atomic nuclei of the target object 10 in a constant direction. A precise and accurate MR image of the target object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide spatial information of each region of the target object 10 by differently inducing resonance frequencies according to the regions of the target object 10.

The RF coil 26 may emit an RF signal toward a patient and may receive an MR signal emitted from the patient. In detail, the RF coil 26 may transmit, toward atomic nuclei included in the patient and having precessional motion, an RF signal having the same frequency as that of the precessional motion, may stop transmitting the RF signal, and then may receive an MR signal emitted from the patient.

For example, to transit an atomic nucleus from a low energy state to a high energy state, the RF coil 26 may generate and apply an electromagnetic wave signal that is an RF signal corresponding to a type of the atomic nucleus, to the target object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the target object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

Hereinafter, it is assumed that the RF coil 26 is an RF multi-coil including N coils that respectively correspond to first through N channels that are a plurality of channels. In this regard, the RF multi-coil may also be referred to as a multi-channel RF coil.

The gantry 20 may further include a display 29 disposed outside the gantry 20 and a display disposed inside the gantry 20. The gantry 20 may provide predetermined information to the user or the target object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the target object 10 through the RF coil 26 during a transmission mode, and receive the MR signal from the target object 10 through the RF coil 26 during a reception mode. The transmission and reception switch 34 may be controlled by a control signal output by an RF controller 56.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the target object 10, a power supply state, a state of a thermal exchanger, and a state of a compressor.

The object monitor 44 monitors a state of the target object 10. In detail, the object monitor 44 may include a camera for observing a movement or position of the target object 10, a respiration measurer for measuring the respiration of the target object 10, an electrocardiogram (ECG) measurer for measuring the electrical activity of the target object 10, or a temperature measurer for measuring a temperature of the target object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system controller 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating portion 60. Here, the pulse sequence includes all information used to control the gradient amplifier 32, the RF transmitter 36, the RF receiver 38, and the transmission and reception switch 34. For example, the pulse sequence may include information about a strength (or an intensity), an application time, and application timing of a pulse signal applied to the gradient coil 24.

The operating portion 60 may request the system controller 50 to transmit pulse sequence information while controlling an overall operation of the MRI system.

The operating portion 60 may include an image processor 62 for processing the MR signal received by the RF receiver 38, an output interface 64, and an input interface 66.

The image processor 62 may process the MR signal received from the RF receiver 38 to generate MR image data of the object 10.

The image processor 62 performs any one of various signal processes, such as amplification, frequency transformation, phase detection, low frequency amplification, and filtering, on the MR signal received by the RF receiver 38.

The image processor 62 may arrange digital data in a k-space of a memory, and may rearrange the digital data into image data via 2D or 3D Fourier transformation.

The image processor 62 may perform a composition process or a difference calculation process on the image data. The composition process may include an addition process performed on a pixel or a maximum intensity projection (MIP) process performed on a pixel. The image processor 62 may store not only the rearranged image data but also image data on which a composition process or a difference calculation process is performed, in a memory or an external server.

The image processor 62 may perform any of the signal processes on the MR signal in parallel. For example, the image processor 62 may perform a signal process on a plurality of MR signals received by a multi-channel RF coil in parallel to rearrange the plurality of MR signals into image data.

The output interface 64 may output image data generated or rearranged by the image processor 62 to the user. The output interface 64 may also output information used for the user to manipulate the MRI system, such as a user interface (UI), user information, or object information. The output interface 64 may include a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input interface 66. The input interface 66 may be a keyboard, a mouse, a track ball, a voice recognizer, a gesture recognizer, a touch screen, or any one of other various input devices that are well known to one of ordinary skill in the art.

Referring to FIG. 1, the signal transceiver 30, the monitor 40, the system controller 50, and the operating portion 60 are separate components, but it will be obvious to one of ordinary skill in the art that respective functions of the signal transceiver 30, the monitor 40, the system controller 50, and the operating portion 60 may be performed by another component. For example, the image processor 62 converts the MR signal received from the RF receiver 38 into a digital signal in FIG. 1, but alternatively, the conversion of the MR signal into the digital signal may be directly performed by the RF receiver 38 or the RF coil 26.

The gantry 20, the RF coil 26, the signal transceiver 30, the monitor 40, the system controller 50, and the operating portion 60 may be connected to each other by wire or wirelessly, and when they are connected wirelessly, the MRI system may further include an apparatus for synchronizing clock signals therebetween. Communication between the gantry 20, the RF coil 26, the signal transceiver 30, the monitor 40, the system controller 50, and the operating portion 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 2:
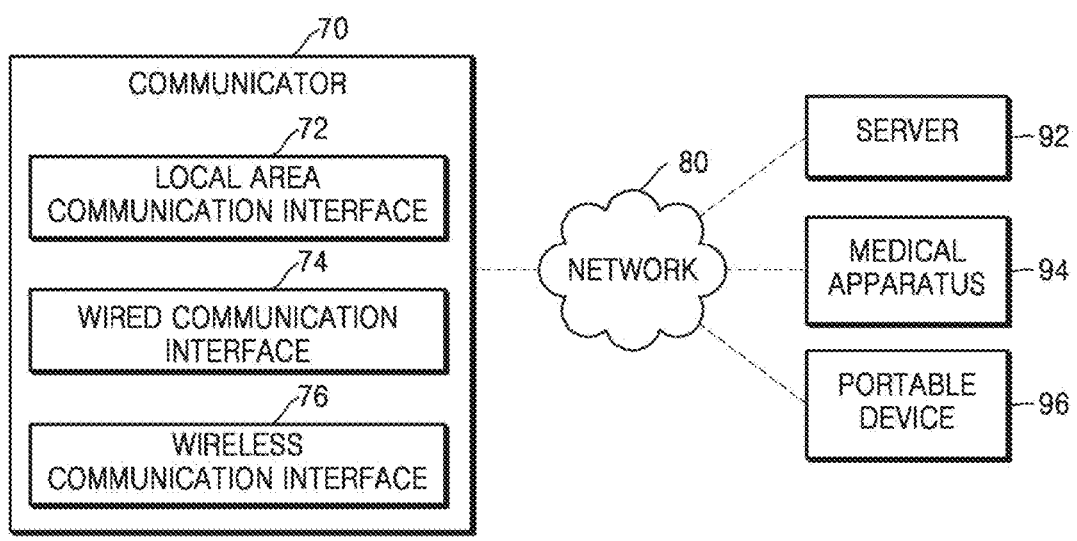
FIG. 2 is a block diagram of a communicator according to an exemplary embodiment.

FIG. 2 is a block diagram of a communicator 70 according to an exemplary embodiment. The communicator 70 may be connected to any one or any combination of the gantry 20, the signal transceiver 30, the monitor 40, the system controller 50, and the operating portion 60 of FIG. 1.

The communicator 70 may transmit and receive data to and from a hospital server or another medical apparatus in a hospital, which is connected through a picture archiving and communication system (PACS), and may perform data communication according to the digital imaging and communications in medicine (DICOM) standard.

As shown in FIG. 2, the communicator 70 may be connected to a network 80 in a wired or wireless manner to communicate with a server 92, a medical apparatus 94, or a portable device 96.

In detail, the communicator 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communicator 70 may receive a diagnosis history or a treatment schedule of the object from the server 92 and use the same to diagnose the object. The communicator 70 may perform data communication not only with the server 92 or the medical apparatus 94 in a hospital, but also with the portable device 96, such as a mobile phone, a personal digital assistant (PDA), or a laptop of a doctor or patient.

Also, the communicator 70 may transmit information about a malfunction of the MRI system or about a medical image quality to a user through the network 80, and receive a feedback regarding the information from the user.

The communicator 70 may include at least one component enabling communication with an external apparatus. For example, the communicator 70 may include a local area communication interface 72, a wired communication interface 74, and a wireless communication interface 76.

The local area communication interface 72 refers to an interface for performing local area communication with an apparatus within a predetermined distance. Examples of local area communication technology according to an exemplary embodiment may include, but are not limited to, a wireless local area network (LAN), Wi-Fi, Bluetooth, Zig-Bee, Wi-Fi direct (WFD), ultra wideband (UWB), infrared data association (IrDA), Bluetooth low energy (BLE), and near field communication (NFC).

The wired communication interface 74 refers to an interface for performing communication by using an electric signal or an optical signal. Examples of wired communication technology according to an exemplary embodiment may include wired communication techniques using a pair cable, a coaxial cable, and an optical fiber cable, and other well known wired communication techniques.

The wireless communication interface 76 transmits and receives a wireless signal to and from any one or any combination of a base station, an external apparatus, and a server in a mobile communication network. Here, the wireless signal may be a voice call signal, a video call signal, or data in any one of various formats according to transmission and reception of a text/multimedia message.

Figure 3:
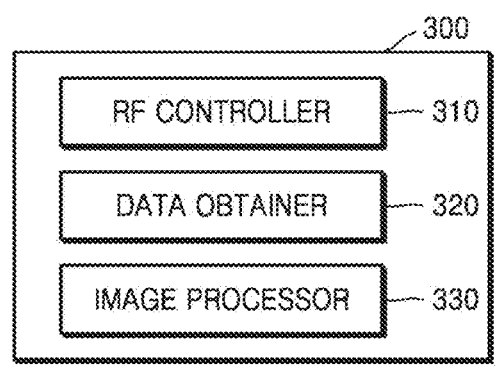
FIG. 3 is a block diagram of an MRI apparatus according to an exemplary embodiment.

FIG. 3 is a block diagram of an MRI apparatus 300 according to an exemplary embodiment.

The MRI apparatus 300 according to the present exemplary embodiment may be all apparatuses capable of scanning and/or processing (or reconstructing) an MR image. In more detail, the MRI apparatus 300 may be an apparatus that applies an RF pulse to a target object via a plurality of channel coils and obtains an MR signal received via the plurality of channel coils.

For example, the MRI apparatus 300 may be included in the MRI system described with reference to FIGS. 1 and 2. When the MRI apparatus 300 is included in the MRI system described with reference to FIG. 1, an RF controller 310, a data obtainer 320, and an image processor 330 of FIG. 3 may respectively correspond to the RF controller 56, the signal transceiver 30, and the image processor 62 of FIG. 1. The aforementioned RF multi-coil may correspond to the RF coil 26 of FIG. 1.

In addition, the MRI apparatus 300 may be a server apparatus that provides a pulse sequence to be applied to a target object, receives an MR signal obtained by performing MRI, and reconstructs an MR image by using the received MR signal. Here, the server apparatus may be a medical-purpose server apparatus in a hospital where an MRI operation is performed on a patient or another hospital.

In more detail, the MRI apparatus 300 may be the server 92, the medical apparatus 94, or the portable device 96 that operates by being connected to the MRI system described with reference to FIGS. 1 and 2. In this regard, the MRI apparatus 300 may receive the MR signal obtained via the MRI system and may perform a reconstruction operation on the MR image.

Referring to FIG. 3, the MRI apparatus 300 according to the present exemplary embodiment includes the RF controller 310, the data obtainer 320, and the image processor 330.

According to the present exemplary embodiment, to capture an MR image of a target object, the RF controller 310 may control information regarding a strength (or an intensity), an application time, and application timing of an RF signal applied to an RF multi-coil. In this regard, the RF multi-coil includes a plurality of channel coils that transmit and receive an RF signal. For example, the RF multi-coil may include n channel coils. Also, the RF multi-coil may correspond to the RF coil 26 of FIG. 1.

The RF controller 310 may be connected to the operating portion 60 of FIG. 1, and may receive an RF pulse sequence from the operating portion 60. In this case, the RF controller 310 may correspond to the RF controller 56 of FIG. 1.

According to the present exemplary embodiment, to obtain an MR image corresponding to a first slice, the RF controller 310 may apply an RF pulse corresponding to the first slice to a target object during a plurality of TR periods. Here, a term "slice" may refer to a unit area on the target object from which the MRI apparatus 300 obtains an MR signal.

In more detail, the RF controller 310 may apply at least one RF pulse corresponding to the first slice to the target object during one TR period. For example, the RF controller 310 may apply a plurality of RF pulses corresponding to the first slice to the target object, based on the spin echo (SE) technique. In this regard, the SE technique involves applying a 180-degree RF pulse to the target object after a free induction decaying (FID) signal due to dephasing of atomic nuclei due to application of a 90-degree RF pulse is emitted.

Alternatively, the RF controller 310 may apply the plurality of RF pulses to the target object according to the fast spin-echo (FSE) technique. In this regard, the FSE technique involves, to obtain a plurality of echoes during one TR period, applying a 90-degree RF pulse, and applying a plurality of 180-degree RF pulses after an FID signal is received. The FSE technique that enables a fast scan, compared to the SE technique, and thus is widely used to obtain MRI data is capable of reducing artifacts and efficiently achieving data.

Alternatively, the RF controller 310 may apply at least one RF pulse to the target object according to the inversion recovery (IR) technique, the gradient echo (GE) technique, the parallel imaging (PI) technique, or the like. However, the RF controller 310 is not limited thereto, and may apply an RF pulse to the target object according to various image capturing techniques.

The first slice may refer to a region that is affected by movement of breathing, heartbeats, peristalsis, etc. of the target object. For example, the first slice may correspond to an abdomen, a chest, a heart, etc. of the target object.

Figure 4:
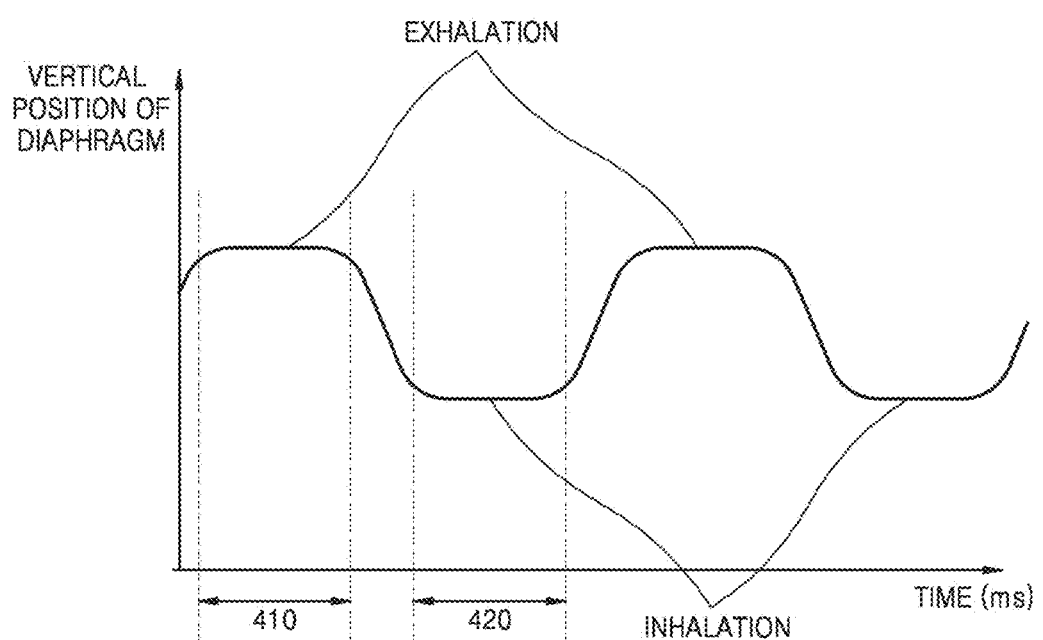
FIG. 4 is a graph illustrating a vertical shift of a position of a diaphragm according to breathing of a target object.

FIG. 4 is a graph illustrating a vertical shift of a position of a diaphragm according to breathing of a target object. Referring to the graph, it is apparent that the position of the diaphragm regularly shifts according to a breathing cycle. Accordingly, organs beneath the diaphragm may expand or contract according to the breathing cycle. Therefore, if the RF controller 310 repeatedly applies RF pulses to the target object corresponding to the first slice without considering the breathing cycle, it is difficult to obtain a high-quality image due to movement of the target object. Therefore, according to the related art, an MR image was generated by analyzing an exhalation period 410 (or an inhalation period 420) of the target object and applying the RF pulses to the target object during only the exhalation period 410. However, the related art has a limit in that the breathing cycle of the target object has to be analyzed, and it is difficult to be flexible with respect to abnormal breathing.

The MRI apparatus 300 according to the present exemplary embodiment provides a method of further applying a navigator RF pulse to the target object, and generating a high-quality MR image by using navigator images obtained by using the navigator RF pulse.

In more detail, the RF controller 310 may apply at least one RF pulse corresponding to the first slice to the target object during one TR period, and then may apply a navigator RF pulse corresponding to a second slice adjacent to the first slice to the target object. In this regard, the fact that slices are adjacent to each other may mean that unit areas on the target object from which an MR signal is obtained are adjacent to each other. For example, the second slice may be a unit area of which start point is an end point of the first slice.

The reason why the navigator RF pulse is applied in correspondence to the second slice adjacent to the first signal may be to prevent an MR signal, which is obtained from the first slice, from being affected by the navigator RF pulse.

The RF controller 310 may apply the navigator RF pulse by using a high-speed image capturing technique. Therefore, a TE according to the navigator RF pulse that is applied to the target object in correspondence to the second slice may be briefer than a TE according to the RF pulse that is applied to the target object in correspondence to the first slice.

For example, the RF controller 310 may apply the navigator RF pulse to the target object by using the echo-planar imaging (EPI) technique. The EPI technique is a high-speed image capturing technique capable of obtaining data by exciting a spin due to one RF pulse by rapidly vibrating a gradient magnetic field coil.

Alternatively, the RF controller 310 may apply the navigator RF pulse by using the spiral pulse sequence technique, the balanced steady state free-precession (bSSFP) technique, the half Fourier acquisition single shot turbo spin echo (HASTE) technique, or the like. However, the RF controller 310 is not limited thereto, and may apply the navigator RF pulse by using various image capturing techniques.

According to the present exemplary embodiment, the data obtainer 320 may obtain k-space data by sampling the MR signal emitted from the target object. In this regard, the k-space data refers to a signal generated by arranging an MR signal in a k-space, wherein the MR signal is an RF signal received from each of channel coils included in a high-frequency multi-coil. The k-space may refer to a group of a plurality of pieces of k-space data with which an image corresponding to each slice is generated.

When the high-frequency multi-coil includes n channel coils, each of the n channel coils may individually receive an MR signal. The data obtainer 320 may obtain n pieces of k-space data that correspond to the n channel coils, respectively, by using MR signals received from the n channel coils, respectively.

The k-space data may be 2D k-space data or 3D k-space data. For example, the 2D k-space data may be generated by a kx axis corresponding to frequency encoding and a ky axis corresponding to phase encoding that have a 2D spatial frequency domain. In addition, the 3D k-space data may be generated by a kx axis and a kz axis that corresponds to a spatial direction of progress. In this regard, the kz axis may correspond to a slice selection gradient magnetic field. Therefore, the k-space data may include position information according to a phase encoding gradient magnetic field, a frequency encoding gradient magnetic field, and the slice selection gradient magnetic field.

In more detail, the data obtainer 320 obtains first k-space data corresponding to the first slice and second k-space data corresponding to the second slice during one TR period. In this regard, the data obtainer 320 may arrange the first k-space data obtained during one TR period in a part of a region of a first k-space, and may arrange the second k-space data in an entire region (i.e., an entirety) of a second k-space. For that purpose, the first k-space data and the second k-space data may be obtained through different sampling patterns. In this regard, a sampling pattern may refer to a pattern formed by obtained signals when a signal of a point is obtained whereas a signal of another point is not obtained in a k-space. Also, a term 'point' may refer to a position in the k-space that corresponds to each of pixels included in an image with a desired resolution. For example, during one TR period, the data obtainer 320 may dispose the first k-space data in a line-form sampling pattern in the part of the region of the first k-space, and may dispose the second k-space data in an 'S'-form sampling pattern in the entire region of the second k-space.

Alternatively, the data obtainer 320 may dispose the second k-space data in a spiral-form sampling pattern in the entire region of the second k-space. Alternatively, the data obtainer 320 may perform full sampling on the first k-space data, and may perform under sampling on the second k-space data. The sampling operations performed by the data obtainer 320 will be described in detail with reference to FIGS. 5 through 7.

The data obtainer 320 may fill an entire region (i.e., an entirety) of the first k-space by using a plurality of pieces of first k-space data obtained during a plurality of TR periods. In this regard, the plurality of pieces of first k-space data respectively obtained during the plurality of TR periods may be disposed in different positions in the k-space, based on position information adjusted according to a phase encoding gradient magnetic field and a frequency encoding gradient magnetic field.

The data obtainer 320 may repeatedly fill the second k-space by using a plurality of pieces of second k-space data respectively obtained during the plurality of TR periods.

In another exemplary embodiment, the data obtainer 320 may include an RF receiver 38 shown in FIG. 1. When the data obtainer 320 includes the RF receiver 38, the data obtainer 320 may autonomously obtain an MR signal by using the RF receiver 38. In more detail, when the MRI apparatus 300 is included in the MRI system of FIG. 1, the data obtainer 320 of the MRI apparatus 300 may equivalently correspond to the signal transceiver 30 including the RF receiver 38.

The image processor 330 may reconfigure the k-space to be image data by Fourier transforming the k-space filled by the data obtainer 320. In addition, the image processor 330 may perform synthesis processing or difference operation processing on the reconfigured image data and thus may generate an MR image.

In more detail, the image processor 330 may generate an MR image corresponding to the first slice, based on a navigator image generated from the second k-space data.

The image processor 330 may generate the navigator image by Fourier transforming the second k-space filled with the second k-space data obtained during one TR period. Therefore, the image processor 330 may generate a plurality of navigator images during a scan time. In this regard, the navigator images generated from a plurality of pieces of data obtained from different TR periods are images of a same region of the target object but may slightly vary according to changes in a state of the target object due to breathing.

The image processor 330 may set, as a reference navigator image, a navigator image that is obtained during a TR period from the plurality of navigator images obtained during the plurality of TR periods. For example, the reference navigator image may be a navigator image obtained during a first TR period or a last TR period. Alternatively, the reference navigator image may be a best quality image among the plurality of navigator images obtained during the plurality of TR periods. Alternatively, the reference navigator image may be an image selected by a user, the image being among the plurality of navigator images obtained during the plurality of TR periods. However, the reference navigator image is not limited thereto.

The image processor 330 may correct first k-space data obtained during a predetermined TR period, according to a difference between the reference navigator image and a navigator image obtained during another TR period. Thus, the image processor 330 may correct a difference between the plurality of pieces of first k-space data according to the changes in the state of the target object.

In more detail, the image processor 330 may divide the reference navigator image into reference blocks, and may divide the other navigator image into comparison blocks, based on image information included in each of the reference blocks. In addition, the image processor 330 may obtain a correction matrix by using a difference between vector information of the reference blocks divided from the reference navigator image with vector information of the comparison blocks divided from the other navigator image. An operation of obtaining the correction matrix, the operation being performed by the image processor 330, will be described in detail with reference to FIG. 9. The image processor 330 may correct the obtained first k-space data by using the correction matrix.

When the difference between the vector information of the reference blocks and the vector information of the comparison blocks is greater than a predetermined threshold value, the image processor 330 may control the RF controller 310 to obtain again first k-space data that was obtained during a TR period corresponding to the compared navigator image. Alternatively, the image processor 330 may delete the first k-space data that was obtained during the corresponding TR period.

In addition, the image processor 330 may generate an MR image, which corresponds to the first slice, from the corrected first k-space data. Therefore, the image processor 330 may generate a clear MR image by using the corrected first k-space data.

In addition, to enhance a quality of the MR image, the image processor 330 may perform image enhancement processing such as noise reduction processing, edge enhancement processing, contrast enhancement processing, or the like.

In addition, a navigator image may have a resolution lower than that of an MR image generated by Fourier transforming the first k-space. In this manner, by applying the navigator RF pulse to the target object by using the high-speed image capturing technique, the scan time may be minimized. In addition, the image processor 330 may generate the low-resolution navigator image and thus may minimize the time used for image processing.

According to the aforementioned descriptions, the RF controller 310 applies the navigator RF pulse during each TR period but is not limited thereto. In another exemplary embodiment, the RF controller 310 may apply the navigator RF pulse to the target object at regular TR period intervals (e.g., an even TR period or an odd TR period). In this case, the image processor 330 may correct the first k-space data obtained during the predetermined TR period, based on a navigator image generated from second k-space data obtained from a next TR period (or a previous TR period). According to the aforementioned descriptions, the RF controller 310 applies the RF pulses corresponding to the first slice and then applies the navigator RF pulse, but in another exemplary embodiment, the RF controller 310 may first apply the navigator RF pulse and then may apply the RF pulses corresponding to the first slice.

Figure 5:
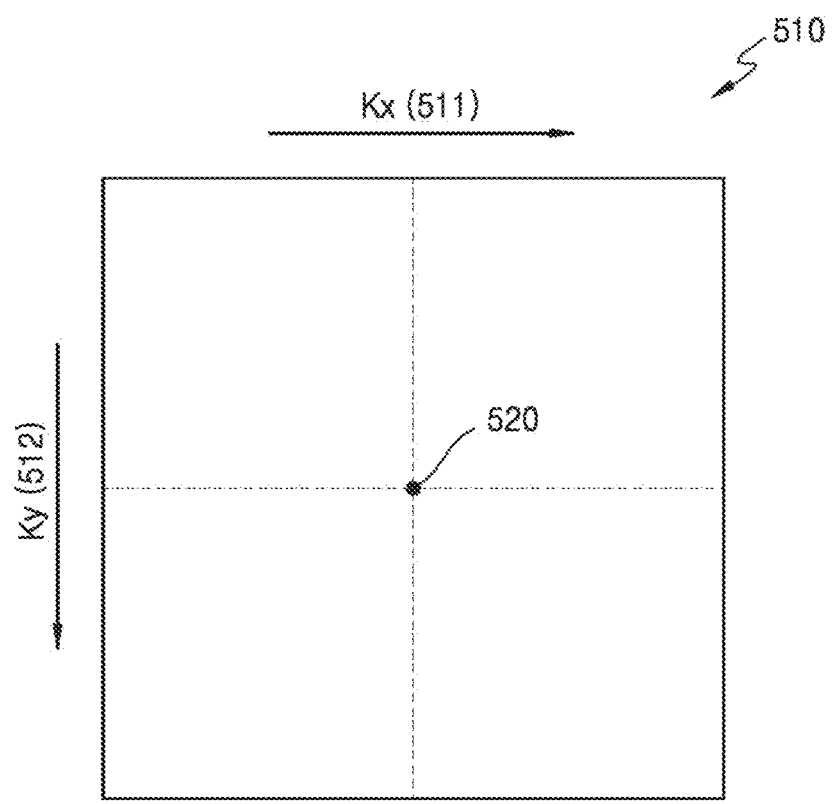
FIG. 5 is a diagram for describing sampling performed by a data obtainer of FIG. 3.

FIG. 5 is a diagram for describing sampling performed by the data obtainer 320 of FIG. 3.

Referring to FIG. 5, the data obtainer 320 may perform a sampling operation in a k-space 510. The k-space 510 shown in FIG. 5 is in a 2D spatial frequency domain and may be formed by a Kx axis 511 corresponding to a frequency encoding gradient magnetic field and a Ky axis 512 corresponding to a phase encoding gradient magnetic field. The data obtainer 320 may perform a sampling operation in a 3D k-space. In this case, the 3D k-space may include the Kx axis and the Ky axis and may further include a Kz axis corresponding to a magnetic field. In this regard, a plane that is perpendicular to the Kz axis in the 3D k-space is a Kx-Ky plane, and a plane that is perpendicular to the Kx axis is a Ky-Kz plane. Hereinafter, for convenience of description, the 2D k-space 510 is referred to, but it is obvious to one of ordinary skill in the art that the exemplary embodiment may also be applied to the 3D k-space.

Because the higher the density of sampled k-space data in the 2D k-space 510, the higher the number of pieces of effective data, thus, the image processor 330 may generate a high-resolution MR image. A central region with respect to a center point 520 of the k-space 510 is a low frequency spatial region. Therefore, k-space data arranged in the central region has more significance, so that, when the k-space data is densely arranged in the central region, the image processor 330 may generate the high-resolution MR image.

The data obtainer 320 may perform the sampling operation in the k-space 510. In more detail, the data obtainer 320 may obtain the k-space data by arranging, in the k-space 510, an MR signal emitted from the target object.

In sampling the k-space data, the data obtainer 320 may obtain k-space data of each slice by sampling an MR signal with respect to each slice. Therefore, the data obtainer 320 may obtain the first k-space data corresponding to the first slice by sampling an MR signal corresponding to the first slice, and may obtain the second k-space data corresponding to the second slice by sampling an MR signal corresponding to the second slice.

FIGS. 6A, 6B, 6C, and 6D are diagrams of a sampling pattern according to example embodiments.

Figure 6A:
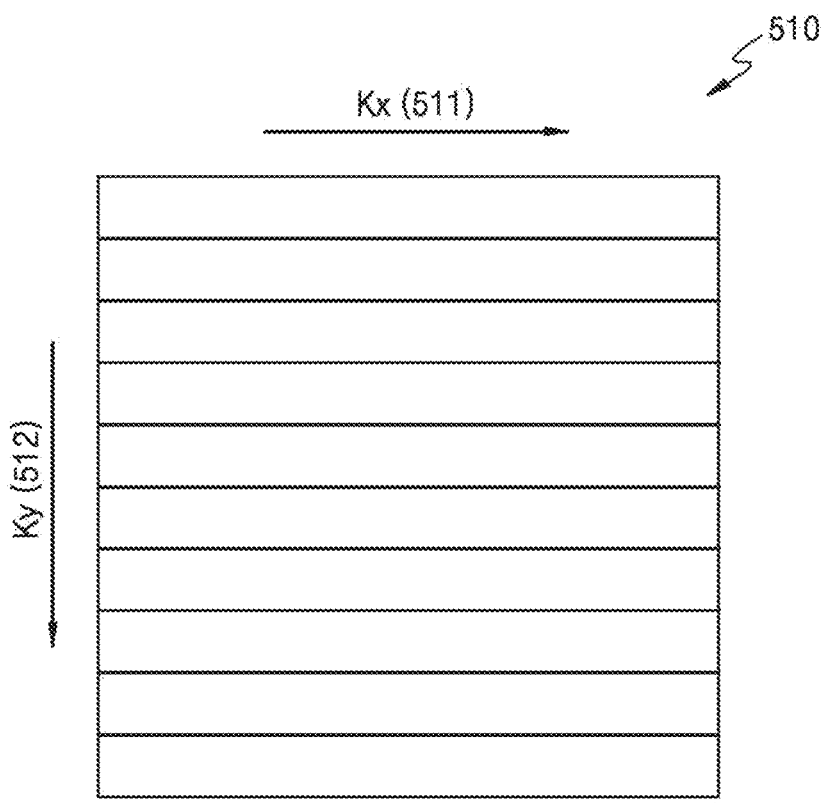
FIGS. 6A, 6B, 6C, and 6D are diagrams of a sampling pattern according to example embodiments.
Figure 6B:
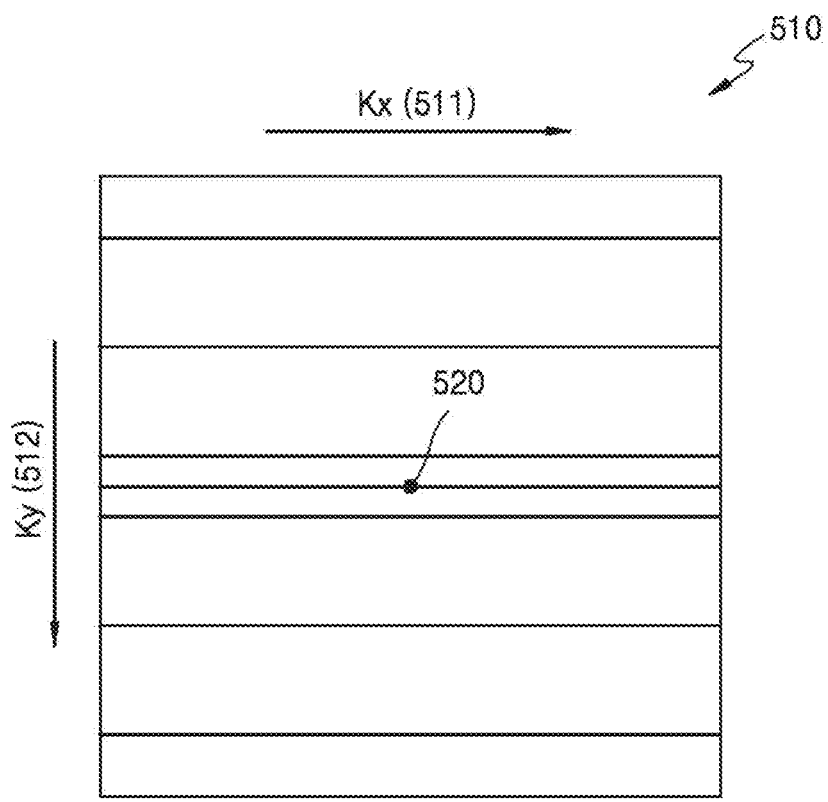

FIGS. 6A and 6B illustrate a line-form sampling pattern. In more detail, FIG. 6A illustrates a case (full sampling) in which signals of all points in a k-space are sampled, and FIG. 6B illustrates a case (under sampling) in which signals are sampled at n some points, rather than all points, in the k-space.

When the data obtainer 320 performs the under sampling, the data obtainer 320 may further perform an operation of reconstructing not-obtained signals. For example, the not-obtained signals may be reconstructed based on an additional calibration signal according to the generalized auto-calibrating partially parallel acquisitions (GRAPHA) technique, coil sensitivity maps having additional coil information according to the simultaneous acquisition of spatial harmonics (SMASH), or the like.

When the RF controller 310 applies RF pulses, the RF controller 310 may adjust the phase encoding gradient magnetic field and the frequency encoding gradient magnetic field, thus, as illustrated in FIG. 6B, the data obtainer 320 may perform sampling on a plurality of pieces of data that are dense in the center region of the k-space.

FIG. 6A illustrates a sampling pattern that may be appropriate to generate a high-resolution image. For example, when the RF controller 310 applies the RF pulses corresponding to the first slice to the target object according to the FSE technique, the data obtainer 320 may obtain the first k-space data in the sampling pattern of FIG. 6A. The data obtainer 320 may obtain the second k-space data in the sampling pattern of FIG. 6B.

Even if the under sampling is performed as shown in FIG. 6B, the data obtainer 320 may obtain a high-resolution image by adjusting an amount of signals to be sampled (i.e., the number of obtained lines). Therefore, the data obtainer 320 may vary the amount of MR signals arranged in the first k-space and the second k-space while the data obtainer 320 obtains the first k-space data and the second k-space data through the under sampling.

Figure 6C:
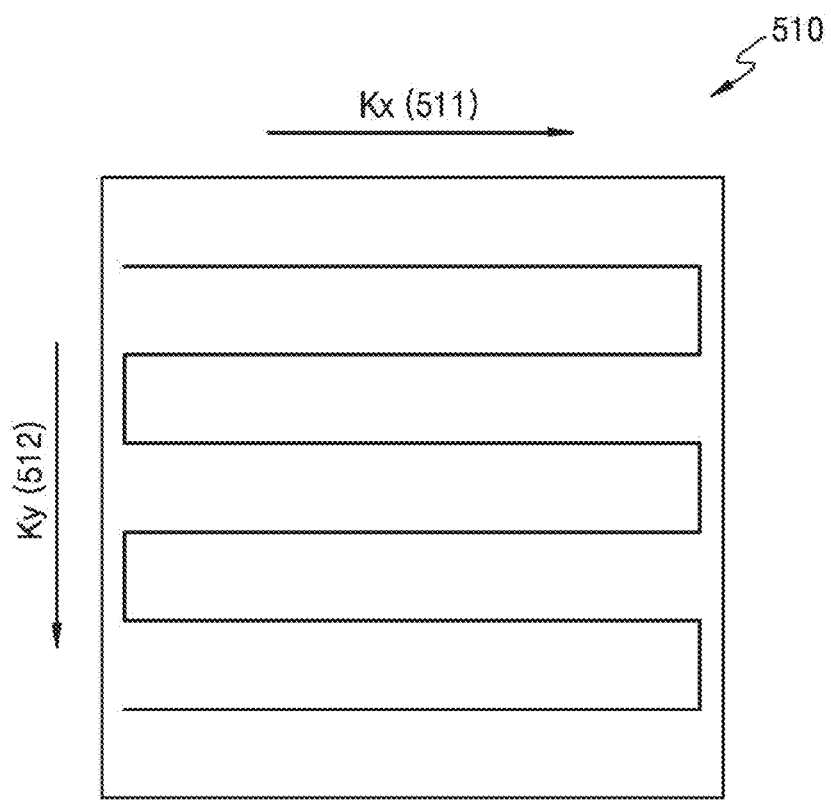
Figure 6D:
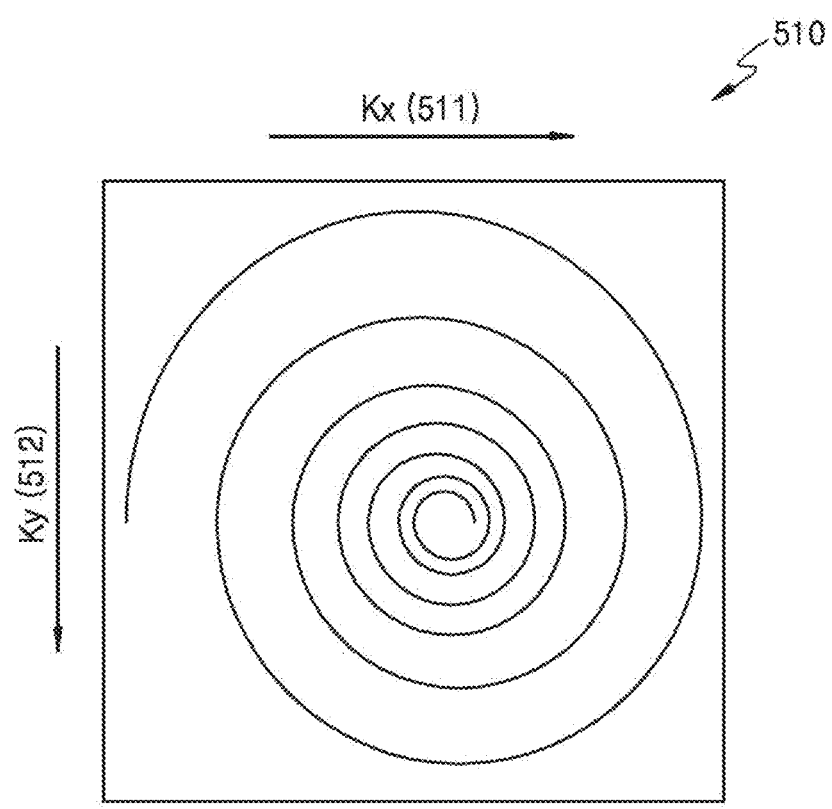

FIG. 6C illustrates an 'S'-form sampling pattern, and FIG. 6D illustrates a spiral-form sampling pattern. The sampling patterns shown in FIGS. 6C and 6D may be appropriate for generating an image according to the high-speed image capturing technique. For example, when the RF controller 310 applies the navigator RF pulse corresponding to the second slice to the target object by using the EPI technique, the data obtainer 320 may obtain the second k-space data in the sampling pattern of FIG. 6C. Alternatively, the data obtainer 320 may obtain the second k-space data in the sampling pattern of FIG. 6D.

FIG. 7 is a diagram illustrating an operation performed by the MRI apparatus 300 of FIG. 3.

The MRI apparatus 300 may apply one or more RF pulses corresponding to the first slice and the navigator RF pulse corresponding to the second slice to the target object during one TR period.

Referring to a graph 701 of FIG. 7, the RF controller 310 may apply a 90-degree RF pulse 711 corresponding to the first slice to the target object in the gantry 20 (refer to FIG. 1) where a gradient magnetic field is generated, according to the FSE technique, and then may apply five 180-degree RF pulses 712. In addition, the RF controller 310 may apply a navigation RF pulse 713 corresponding to the second slice to the target object, according to the EPI technique.

According to a graph 702, the data obtainer 320 may sample an MR signal emitted from the target object. The data obtainer 320 may sample an MR signal 721, which corresponds to the first slice, to first k-space data 732 in a line-form.

In addition, the data obtainer 320 may sample an MR signal 722, which corresponds to the second slice, to second k-space data 736 in an 'S'-form.

The data obtainer 320 may store the first k-space data 732 and the second k-space data 736 in separate first and second k-spaces 731 and 735. As illustrated in FIG. 7, the first k-space data 732 may be filled in a part of a region of the first k-space 731 during one TR period, and the second k-space data 736 may be filled in an entire region of the second k-space 735. However, density of the second k-space data 736 arranged in the second k-space 735 may be lower than that in the first k-space 731. Therefore, a resolution of a navigator image generated in the second k-space 735 may be lower than that of an MR image generated in the first k-space 731.

FIG. 8 is a diagram illustrating another operation performed by the MRI apparatus 300 of FIG. 3. With reference to FIG. 8, for convenience of description, it is assumed that the MRI apparatus 300 generates an MR image from MR signals obtained during 3 TR periods, the MR image corresponding to the first slice.

Referring to a graph 801, during the 3 TR periods, the RF controller 310 may apply a 90-degree RF pulse and five 180-degree RF pulses 811, 813, and 815 to the target object to obtain MR signals from the first slice, and then may sequentially apply navigator RF pulses 812, 814, and 816 to the target object.

According to a graph 802, the data obtainer 320 may arrange a plurality of pieces of first k-space data 832, 833, and 834 in different positions of a first k-space 831, wherein the plurality of pieces of first k-space data 832, 833, and 834 are sampled from MR signals 821, 823, and 825 corresponding to the first slice. In this regard, because gradient magnetic fields that are different from each other in the 3 TR periods are generated in the gantry 20 (refer to FIG. 1), the MR signals 821, 823, and 825 corresponding to the first slice may each have different position information.

In addition, the data obtainer 320 may arrange a plurality of pieces of second k-space data 842, 844, and 846 in a plurality of second k-spaces 841, 843, and 845, wherein the plurality of pieces of second k-space data 842, 844, and 846 are sampled from MR signals 822, 824, and 826 corresponding to the second slice. Therefore, the image processor 330 may generate 3 navigator images from the plurality of second k-spaces 841, 843, and 845 filled with the plurality of pieces of second k-space data 842, 844, and 846.

In addition, the image processor 330 may correct the plurality of pieces of first k-space data 832, 833, and 834 of the first k-space 831 by using the 3 navigator images. The image processor 330 may generate an MR image corresponding to the first slice by Fourier transforming the first k-space 831 including the plurality of pieces of corrected data.

Figure 9:
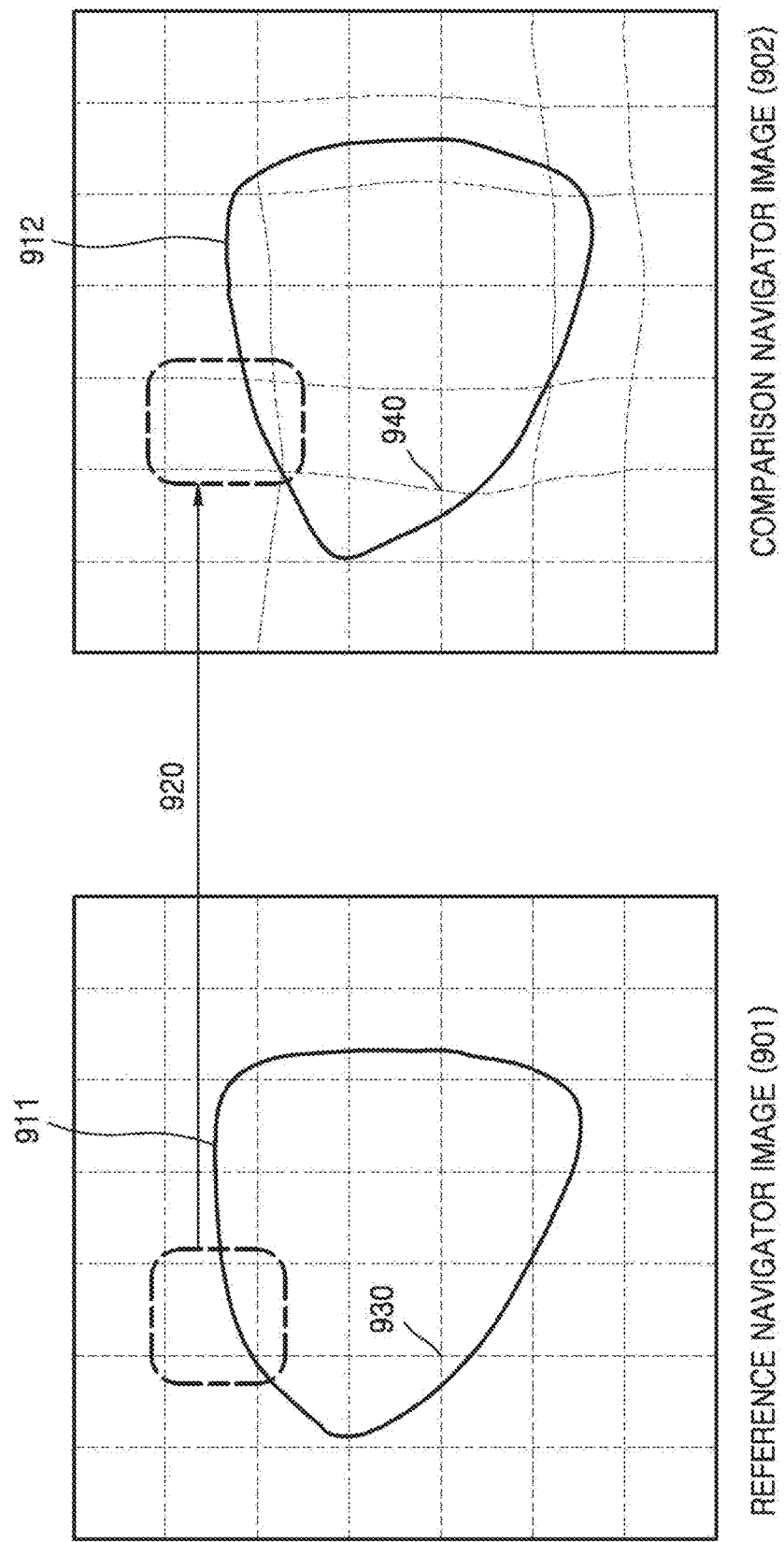
FIG. 9 is a diagram for describing an operation of generating a correction matrix, the operation being performed by an image processor of FIG. 3.

FIG. 9 is a diagram for describing an operation of generating a correction matrix, the operation being performed by the image processor 330 of FIG. 3. For convenience of descriptions, it is assumed that a first navigator image generated from the second k-space data 842 obtained during a first TR period 803 of FIG. 8 is a reference navigator image 901 including an organ 911, and a second navigator image generated from the second k-space data 844 obtained during a second TR period 804 is a comparison navigator image 902 including an organ 912. Hereinafter, a method of correcting the first k-space data 833 obtained during a second TR period 804 of FIG. 8, based on a difference between the reference navigator image 901 and the comparison navigator image 902, will now be described.

In more detail, the image processor 330 may divide the reference navigator image 901 into a plurality of reference blocks. For example, as illustrated in FIG. 9, the reference navigator image 901 may be divided into 7×7 reference blocks.

The image processor 330 may obtain image information included in each of the reference blocks. In this regard, the image information may include information about a point, a segment, a polygon, a curve, or the like included in each of the reference blocks.

The image processor 330 may divide the comparison navigator image 902 into 7×7 comparison blocks, based on the image information included in each reference block. In more detail, referring to a reference numeral 920, the image processor 330 may determine comparison blocks that match the plurality of pieces of image information of the reference blocks, respectively.

In more detail, the image processor 330 may obtain first vector information of points (e.g., a point 930) where the reference blocks cross each other in the reference navigator image 901, and may obtain second vector information of points (e.g., a point 940) where the comparison blocks cross each other in the comparison navigator image 902. The image processor 330 may obtain a correction matrix for transforming the comparison navigator image 902 to the reference navigator image 901, based on a difference between the first vector information and the second vector information. For example, the image processor 330 may obtain the correction matrix by using the b-spline grid registration technique. Alternatively, the image processor 330 may select one of predefined correction matrices, based on the difference between the first vector information and the second vector information.

The image processor 330 may correct the first k-space data 833 obtained during the second TR period 804, by using the obtained correction matrix. The image processor 330 may repeat the aforementioned operations and thus may correct third k-space data 815 obtained during a third TR period 805. In this case, a comparison navigator image may be a third navigator image generated in the second k-space data 846 obtained during a third TR period 805.

Alternatively, the image processor 330 may correct an image generated in the not-corrected first k-space data 333 by using the correction matrix. In this case, the image processor 330 may generate a final MR image by synthesizing the corrected images.

In another exemplary embodiment, the image processor 330 may obtain, from the reference navigator image, only image information regarding blocks including a boundary of the organ 911. Therefore, the image processor 330 may decrease a time taken in obtaining image information from all blocks.

Figure 10:
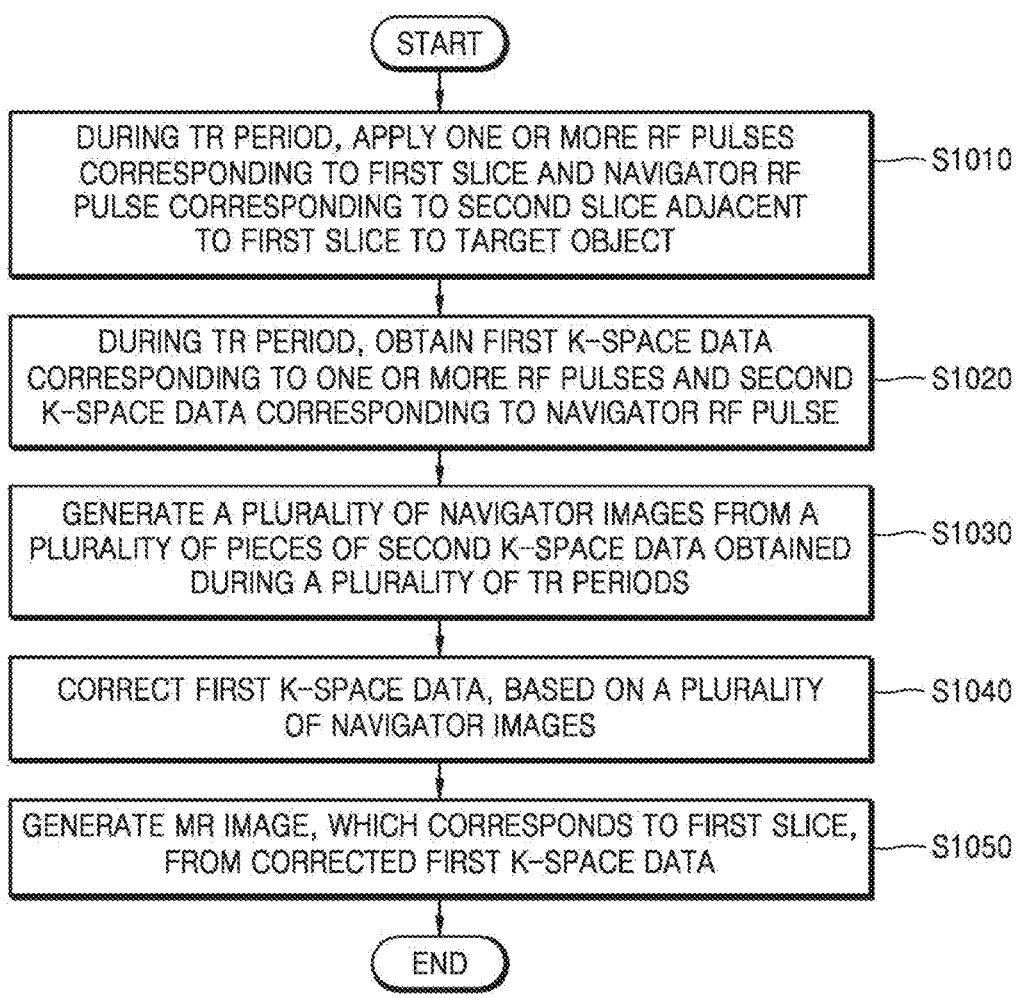
FIG. 10 is a flowchart of a method of generating an MR image, the method being performed by the MRI apparatus of FIG. 3, according to an exemplary embodiment.
Figure 11:
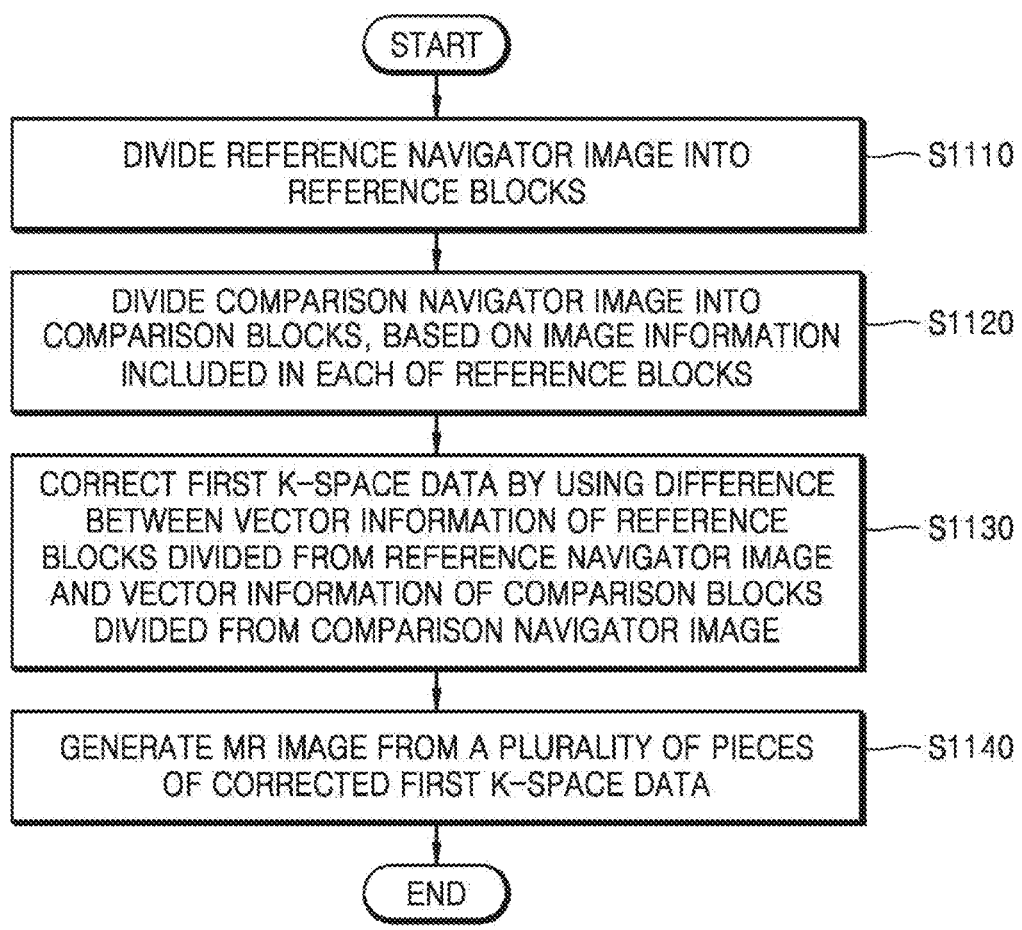
FIG. 11 is a flowchart of a method of correcting first k-space data by using navigator images, the method being performed by the MRI apparatus of FIG. 3, according to an exemplary embodiment.

FIGS. 10 and 11 are flowcharts for describing a method of generating an MR image, the method being performed by the MRI apparatus 300, according to exemplary embodiments. The MR image generating method by the MRI apparatus 300 illustrated in FIGS. 10 and 11 is related to the exemplary embodiments described above with reference to FIGS. 1 through 9. Therefore, hereinafter, although descriptions are omitted, if the descriptions are described above with reference to FIGS. 1 through 9, the descriptions may also be applied to the flowcharts of FIGS. 10 and 11.

FIG. 10 is a flowchart of a method of generating an MR image, the method being performed by the MRI apparatus 300 of FIG. 3, according to an exemplary embodiment.

Referring to FIG. 10, in operation S1010, the MRI apparatus 300 may apply one or more RF pulses corresponding to a first slice and a navigator RF pulse corresponding to a second slice adjacent to the first slice to a target object, during a TR period.

For example, the MRI apparatus 300 may apply a plurality of RF pulses corresponding to the first slice to the target object, according to the SE technique. Alternatively, the MRI apparatus 300 may apply the plurality of RF pulses corresponding to the first slice to the target object, according to the FSE technique. The FSE technique that enables a fast scan, compared to the SE technique, and thus is widely used to obtain MRI data is capable of reducing artifacts and efficiently achieving data. However, the application technique is not limited thereto, and the MRI apparatus 300 may apply one or more RF pulses to the target object, according to the IR technique, the GE technique, the PI technique, or the like.

The first slice may refer to a region that is affected by movement of breathing, heartbeats, peristalsis, etc. of the target object. For example, the first slice may correspond to an abdomen, a chest, a heart, etc. of the target object. Therefore, the MRI apparatus 300 may additionally apply the navigator RF pulse to the target object during the TR period to generate a high quality MR image, regardless of a breathing cycle, etc., of the target object.

In more detail, the MRI apparatus 300 may apply the navigator RF pulse corresponding to the second slice adjacent to the first slice to the target object. In this regard, the fact that the first slice and the second slice are adjacent to each other may mean that unit areas on the target object from which an MR signal is obtained are adjacent to each other. For example, the second slice may be a unit area of which start point is an end point of the first slice. Therefore, areas of the target object that the first slice and the second slice represent may include same or similar organs. In addition, because the MRI apparatus 300 applies the navigator RF pulse to the second slice adjacent to the first slice, the MRI apparatus 300 may prevent an MR signal, which is obtained from the first slice, from being affected by the navigator RF pulse.

In addition, the MRI apparatus 300 may apply the navigator RF pulse by using the high-speed image capturing technique. Therefore, a TE according to the navigator RF pulse may be briefer than a TE according to the RF pulses that are applied to the target object in correspondence to the first slice.

For example, the MRI apparatus 300 may apply the navigator RF pulse to the target object by using the EPI technique. The EPI technique is a high-speed image capturing technique capable of obtaining data by exciting a spin due to one RF pulse by rapidly vibrating a gradient magnetic field coil.

Alternatively, the MRI apparatus 300 may apply the navigator RF pulse by using the spiral pulse sequence technique, the bSSFP technique, the HASTE technique, or the like. However, the MRI apparatus 300 is not limited thereto, and may apply the navigator RF pulse by using various image capturing techniques.

In operation S1020, the MRI apparatus 300 may obtain first k-space data corresponding to the one or more RF pulses and second k-space data corresponding to the navigator RF pulse, during the TR period.

In this regard, the data obtainer 320 may arrange first k-space data obtained during one TR period in a part of a region of a first k-space, and may arrange second k-space data in an entire region of a second k-space. For that purpose, the first k-space data and the second k-space data may be obtained through different sampling patterns. In this regard, a sampling pattern may refer to a pattern formed by obtained signals when a signal of a point is obtained whereas a signal of another point is not obtained in a k-space. Also, a term 'point' may refer to a position in the k-space that corresponds to each of pixels included in an image with a desired resolution.

In more detail, the MRI apparatus 300 may allow a sampling pattern of the first k-space data to be different from a sampling pattern of the second k-space data to densely arrange the first k-space data in the k-space. For example, the first k-space data may be obtained in a line-form sampling pattern, and the second k-space data may be obtained in an 'S'-form sampling pattern. Alternatively, the second k-space data may be obtained in a spiral-form sampling pattern. However, the exemplary embodiment is not limited thereto, and the MRI apparatus 300 may obtain the first k-space data and the second k-space data by applying various sampling patterns thereto. Alternatively, the MRI apparatus 300 may obtain the first k-space data by performing full sampling and may obtain the second k-space data by performing under sampling.

The MRI apparatus 300 may fill the first k-space corresponding to the first slice with the first k-space data obtained during a plurality of TR periods by repeating operations S1010 and S1020. In this regard, a plurality of pieces of first k-space data respectively obtained during the plurality of TR periods may be arranged in different positions of the k-space, based on position information adjusted according to a phase encoding gradient magnetic field and a frequency encoding gradient magnetic field.

The MRI apparatus 300 may repeatedly fill the second k-space with a plurality of pieces of second k-space data obtained during the plurality of TR periods, by using the high-speed image capturing technique. Alternatively, the MRI apparatus 300 may fill a plurality of second k-spaces with the plurality of pieces of second k-space data obtained during the plurality of TR periods.

In operation S1030, the MRI apparatus 300 may generate a plurality of navigator images from the plurality of pieces of second k-space data obtained during the plurality of TR periods.

The MRI apparatus 300 may generate one navigator image by Fourier transforming a second k-space where second k-space data obtained during one TR period is arranged. In this regard, the plurality of navigator images generated from the plurality of pieces of second k-space data obtained during the plurality of TR periods, respectively, are images of a same region of the target object but may slightly vary according to changes in a state of the target object due to breathing. The navigator images may have a resolution lower than that of an MR image generated by Fourier transforming the first k-space.

In operation S1040, the MRI apparatus 300 may correct the first k-space data, based on the plurality of navigator images.

In more detail, the MRI apparatus 300 may set, as a reference navigator image, a navigator image that is obtained during a TR period from the plurality of navigator images. For example, the reference navigator image may be a navigator image obtained during a first TR period or a last TR period. Alternatively, the reference navigator image may be a best quality image among the plurality of navigator images obtained during the plurality of TR periods. Alternatively, the reference navigator image may be an image selected by a user, the image being among the plurality of navigator images obtained during the plurality of TR periods. However, the reference navigator image is not limited thereto.

The MRI apparatus 300 may correct first k-space data obtained during a predetermined TR period, according to a difference between the reference navigator image and a navigator image obtained during the predetermined TR period. A method of correcting the first k-space data by using the navigator images, the method being performed by the MRI apparatus 300, will be described in detail with reference to FIG. 11.

In operation S1050, the MRI apparatus 300 may generate an MR image, which corresponds to the first slice, from the corrected first k-space data. Therefore, the MRI apparatus 300 may generate a high quality MR image, regardless of changes in a state of the target object due to breathing.

In addition, to enhance a quality of the MR image, the MRI apparatus 300 may perform additional image enhancement processing such as noise reduction processing, edge enhancement processing, contrast enhancement processing, or the like.

FIG. 11 is a flowchart of a method of correcting first k-space data by using navigator images, the method being performed by the MRI apparatus 300 of FIG. 3, according to an exemplary embodiment.

Referring to FIG. 11, in operation S1110, the MRI apparatus 300 may divide a reference navigator image into reference blocks. For example, the MRI apparatus 300 may divide the reference navigator image 901 into 7×7 reference blocks, as illustrated in FIG. 9.

In operation S1120, the MRI apparatus 300 may divide a comparison navigator image into comparison blocks, based on image information included in each of the reference blocks. In this regard, the image information may include information about a point, a segment, a polygon, a curve, or the like included in each of the reference blocks.

In more detail, the MRI apparatus 300 may divide the comparison navigator image into a same number of blocks (e.g., 7×7 blocks) to match the image information of each of the reference blocks. Here, a shape of each of the reference blocks of the reference navigator image may be different from a shape of each of the comparison blocks of the comparison navigator image, according to changes in a state of the target object.

In operation S1130, the MRI apparatus 300 may correct the first k-space data by using a difference between vector information of the reference blocks divided from the reference navigator image and vector information of the comparison blocks divided from the comparison navigator image.

For example, the MRI apparatus 300 may obtain first vector information of points where the reference blocks cross each other in the reference navigator image, and may obtain second vector information of points where the comparison blocks cross each other in the comparison navigator image. The MRI apparatus 300 may obtain a correction matrix for transforming the comparison navigator image to the reference navigator image, based on a difference between the first vector information and the second vector information. For example, the MRI apparatus 300 may obtain the correction matrix by using the b-spline grid registration technique.

The MRI apparatus 300 may correct, by using the correction matrix, first k-space data obtained during a TR period in which the comparison navigator image is obtained. In this manner, the MRI apparatus 300 may obtain the correction matrix by using the navigator images and the reference navigator image generated from the plurality of pieces of second k-space data obtained from the TR periods, respectively, and may correct the first k-space data of each of the TR periods by using the correction matrix.

In operation S1140, the MRI apparatus 300 may generate an MR image from a plurality of pieces of corrected first k-space data.

Alternatively, the MRI apparatus 300 may correct an MR image generated from the plurality of pieces of not-corrected first k-space data by using the correction matrix. In this case, the MRI apparatus 300 may generate a final MR image by synthesizing the corrected MR images.

Alternatively, the MRI apparatus 300 may obtain, from the reference navigator image, only image information regarding the reference blocks including a boundary of an organ. By doing so, the MRI apparatus 300 may decrease a time taken in determining comparison blocks to be matched with the reference blocks.

Figure 12:
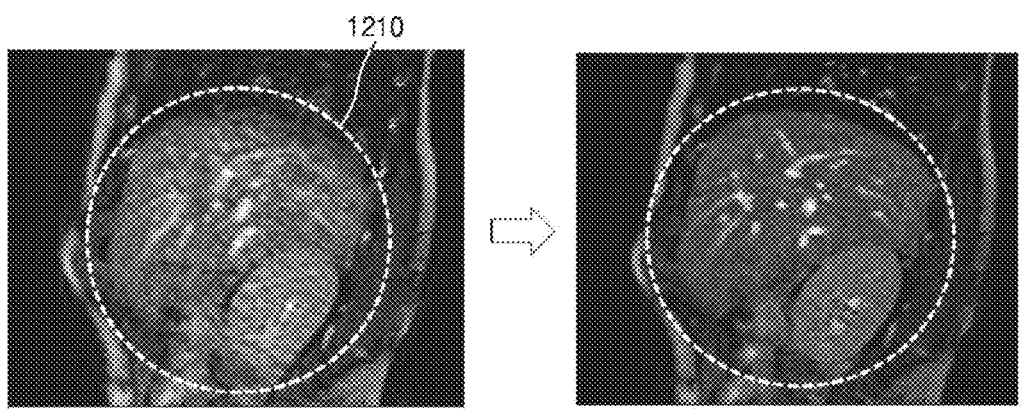
FIG. 12 shows an original MR image that is obtained using a fast spin-echo (FSE) technique, and an MR image that is corrected by the MRI apparatus of FIG. 3, using a navigator image, according to an exemplary embodiment.

FIG. 12 shows an original MR image that is obtained using the FSE technique, and an MR image that is corrected by the MRI apparatus 300 of FIG. 3, using a navigator image, according to an exemplary embodiment.

As described above, the MRI apparatus 300 and the MR image generating method according to the exemplary embodiments may correct k-space data of a target slice obtained during each TR period, by using navigator images generated from adjacent slices, and thus may generate a high quality MR image, regardless of a breathing cycle, etc., of a target object.

The image shown in the left in FIG. 12 may correspond to an MR image obtained by using the general FSE technique, and the image shown in the right in FIG. 12 may correspond to an MR image generated by correcting k-space data of a target slice based on a relation between navigator images. In this manner, the MRI apparatus 300 may correct a boundary 1210 among organs to be clear by using the relation between the navigator images, wherein the boundary 1210 was used to be unclear due to a breathing motion, etc., of a target object.

The exemplary embodiments can be written as computer programs and can be implemented in general-use digital computers that execute the programs using a computer readable recording medium.

When it is necessary for a processor of the computer to communicate with any other remote computer, a remote server, or the like to perform the aforementioned functions, the processor of the computer may further include information regarding how to communicate with the other remote computer, the remote server, or the like by using a communication interface (e.g., wired and/or wireless communication interfaces) of the computer, information regarding which information or media has to be exchanged during the communication, or the like.

Also, functional programs, code, and code segments for accomplishing the exemplary embodiments can be easily construed or changed by programmers skilled in the art to which the exemplary embodiments pertain, by taking into account a system environment of a computer that executes programs by reading a recording medium.

Examples of the computer-readable recording medium include ROM, RAM, CD-ROM, magnetic tapes, floppy disks, optical media storages, etc.

The recording medium that is readable by the computers having recorded thereon the programs can also be distributed over network coupled computer systems so that the computer readable code is stored and executed in a distributed fashion. In this case, any one or any combination of the distributed computers may perform some functions of the aforementioned functions and may transmit results thereof to any one or any combination of the distributed computers, and the computer having received the results may perform some functions of the aforementioned functions and may also provide results thereof to other distributed computers.

It will be apparent that all elements of the exemplary embodiments are not limited to be combined or to operate as one combination. That is, all elements may be selectively combined and may operate as one within the scope of the present disclosure.

In addition, all elements may be each implemented as independent hardware, or some or all of the elements may be selectively combined to operate as a computer program having a program module that performs some or all of combined functions in hardware or a plurality of pieces of hardware. Codes and code segments for configuring the computer program can be easily construed by one of ordinary skill in the art to which the exemplary embodiments pertain. The computer program may implement the exemplary embodiments of the present specification by being stored in a non-transitory computer-readable recording medium and being read and executed by a computer. Examples of the non-transitory computer-readable recording medium include magnetic recording media, optical recording media, or the like.

While this disclosure has been shown and described with reference to the exemplary embodiments thereof, it will be understood by one of ordinary skill in the art that various changes in form and details may be made therein without departing from the spirit and scope of the disclosure as defined by the appended claims. The exemplary embodiments may be considered in a descriptive sense only and not for purposes of limitation. Therefore, the scope of the disclosure is defined not by the detailed description of the disclosure but by the appended claims, and all differences within the scope will be construed as being included in the present disclosure.

What is claimed is:

1. A magnetic resonance imaging (MRI) apparatus for generating a magnetic resonance (MR) image during repetition time (TR) periods, the MRI apparatus comprising:
   a radio frequency (RF) controller configured to, during each TR period of the TR periods:
      apply a plurality of RF pulses corresponding to a first single slice to an object; and
      apply a single navigator RF pulse corresponding to a second single slice adjacent to the first single slice to the object after the plurality of RF pulses are applied;
   a signal transceiver configured to, during each TR period of the TR periods:
      obtain first k-space data corresponding to the applied plurality of RF pulses; and
      obtain second k-space data corresponding to the applied single navigator RF pulse; and
   an image processor configured to:
      generate navigator images, based on pieces of the second k-space data that are obtained during the TR periods, the pieces comprising the second k-space data obtained during each TR period of the TR periods;
      correct the first k-space data, based on the navigator images; and
      generate the MR image of the first single slice, based on the corrected first k-space data.

2. The MRI apparatus of claim 1, wherein the signal transceiver is further configured to:
   arrange the first k-space data in a part of a first k-space; and
   arrange the second k-space data in an entirety of a second k-space.

3. The MRI apparatus of claim 1, wherein each of the navigator images is generated based on an entirety of a second k-space in which the second k-space data is arranged.

4. The MRI apparatus of claim 1, wherein a first echo time (TE) corresponding to the plurality of RF pulses is longer than a second TE corresponding to the single navigator RF pulse.

5. The MRI apparatus of claim 1, wherein the image processor is further configured to:
   select a reference navigator image from the navigator images; and
   correct the first k-space data, based on a difference between the navigator images and the selected reference navigator image.

6. The MRI apparatus of claim 5, wherein the image processor is further configured to:
   divide the reference navigator image into reference blocks;
   divide the navigator images into comparison blocks respectively corresponding to the reference blocks; and
   correct the first k-space data, based on a difference between vector information of the reference blocks and vector information of the comparison blocks.

7. The MRI apparatus of claim 1, wherein the RF controller is further configured to apply the single navigator RF pulse to the object at regular TR period intervals during the TR periods.

8. The MRI apparatus of claim 1, wherein the navigator images have a resolution lower than a resolution of the MR image.

9. The MRI apparatus of claim 1, wherein the RF controller is further configured to apply RF pulses corresponding to the first single slice to the object, based on a fast spin-echo technique.

10. The MRI apparatus of claim 1, wherein the RF controller is further configured to apply the single navigator RF pulse to the object, based on an echo-planar imaging technique.

11. A method of generating a magnetic resonance (MR) image during repetition time (TR) periods, the method being performed by a magnetic resonance imaging (MRI) apparatus, and the method comprising:
   applying a plurality of radio frequency (RF) pulses corresponding to a first single slice to an object, and applying a single navigator RF pulse corresponding to a second single slice adjacent to the first single slice to the object after the plurality of RF pulses are applied, during each TR period of the TR periods;
   obtaining first k-space data corresponding to the applied plurality of RF pulses, and obtaining second k-space data corresponding to the applied single navigator RF pulse, during each TR period of the TR periods;
   generating navigator images, based on pieces of the second k-space data that are obtained during the TR periods, the pieces comprising the second k-space data obtained during each TR period of the TR periods;

correcting the first k-space data, based on the navigator images; and generating the MR image of the first single slice, based on the corrected first k-space data.

12. The method of claim 11, wherein the obtaining of the first k-space data comprises arranging the first k-space data in a part of a first k-space, and the obtaining of the second k-space data comprises arranging the second k-space data in an entirety of a second k-space.

13. The method of claim 11, wherein the correcting of the first k-space data comprises:

selecting a reference navigator image from the navigator images; and correcting the first k-space data, based on a difference between the navigator images and the selected reference navigator image.

14. The method of claim 13, wherein the correcting of the first k-space data comprises:

dividing the reference navigator image into reference blocks;

dividing the navigator images into comparison blocks respectively corresponding to the reference blocks; and correcting the first k-space data, based on a difference between vector information of the reference blocks and vector information of the comparison blocks.

15. The method of claim 11, wherein the applying of the single navigator RF pulse comprises applying the single navigator RF pulse to the object at regular TR period intervals during the TR periods.

16. The method of claim 11, wherein the navigator images have a resolution lower than a resolution of the MR image.

17. The method of claim 11, wherein the applying of the plurality of RF pulses comprises applying RF pulses corresponding to the first single slice to the object, based on a fast spin-echo technique.

18. The method of claim 11, wherein the applying of the single navigator RF pulse comprises applying the single navigator RF pulse to the object, based on an echo-planar imaging technique.

19. A non-transitory computer-readable storage medium storing a program for causing a computer to perform the method of claim 11.

20. The MRI apparatus of claim 1, wherein the plurality of RF pulses comprises a single 90-degree RF pulse and a plurality of 180-degree RF pulses after the single 90-degree RF pulse.

* * * * *